Figure 1:
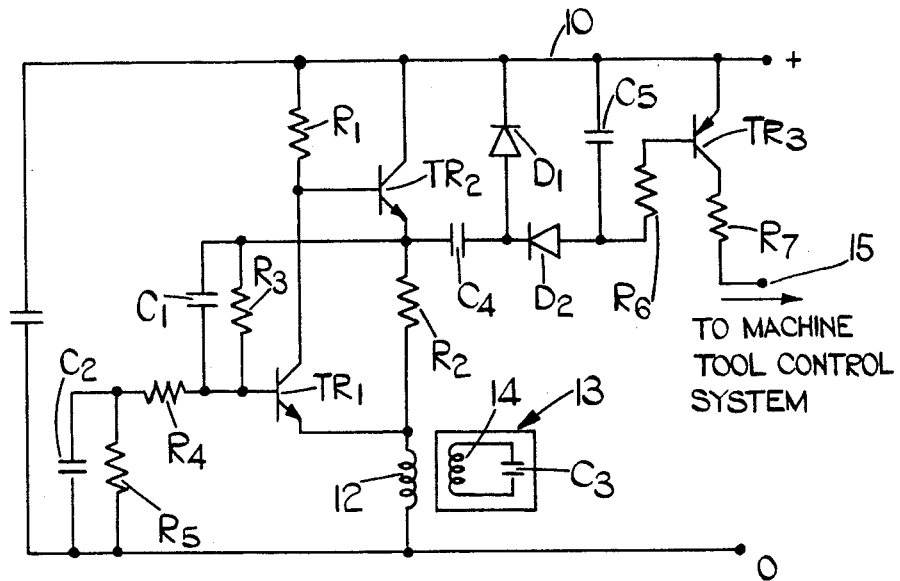

United States Patent [19]

Mainprize

[11] 4,130,763
[45] Dec. 19, 1978

[54] MACHINE GUARD INSTALLATIONS

[75] Inventor: David Mainprize, Tamworth, England

[73] Assignee: Wickman Machine Tool Sales Limited, Coventry, England

[21] Appl. No.: 727,996

[22] Filed: Sep. 30, 1976

[30] Foreign Application Priority Data

Oct. 4, 1975 [GB] United Kingdom ............... 40712/75

[51] Int. Cl.$^2$ ........................................... H01H 35/00
[52] U.S. Cl. .................................... 307/116; 307/326; 331/65; 361/179; 361/203
[58] Field of Search ...................... 361/172, 179, 203; 340/258 R, 258 B, 258 C, 280, 282; 307/116, 125, 326–328; 331/63, 65, 117; 192/133, 134, 130; 194/4 R, 4 C, 4 E, 4 F

[56] References Cited

U.S. PATENT DOCUMENTS

| 2,828,480 | 3/1958 | Golladay | 340/258 R |
| 3,197,658 | 7/1965 | Byrnes et al. | 307/116 |

FOREIGN PATENT DOCUMENTS 1268360  3/1972  United Kingdom ..................... 361/180

Primary Examiner—Harry E. Moose, Jr.
Attorney, Agent, or Firm—Holman & Stern

[57] ABSTRACT

A machine guard installation makes use of a proximity detector system including a passive time circuit on the guard. The timed circuit includes a coil which is magnetically coupled to a further coil only when the guard is in its operative guarding position. The further coil forms a part of a positive feedback loop of an amplifier in an active detector circuit, which oscillates only when the coils are coupled as aforesaid.

13 Claims, 2 Drawing Figures

U.S. Patent   Dec. 19, 1978   4,130,763

MACHINE GUARD INSTALLATIONS

This invention relates to machine guard installations and is particularly but not exclusively concerned with machine tools having guards which are completely removable from the machine tool. Clearly, it is desirable to ensure that the machine tool is not operated whilst the guard is not in position but where a guard is completely removable a tamper proof detection system for detecting the presence of the guard presents difficulties.

It is an object of the present invention to provide a machine guard installation incorporating a reliable and relatively tamper proof guard detection system.

A machine guard installation in accordance with the invention includes a guard movable out of an operative guarding position, a passive tuned circuit mounted on the guard, said tuned circuit including a coil, and an active detector circuit including a coil which is magnetically coupled with the tuned circuit coil when the guard is in its operative guarding position, the tuned circuit then controlling oscillation of the detector circuit.

In its simplest form the installation described above can be used on a normally fixed guard where the presence of the guard will cause the detector to oscillate. In this case it will be appreciated that the detector circuit cannot be "Fooled" like a detector system employing micro-switches (which can be jammed shut by various methods) or a metal detecting pickup (which can be operated by a piece of metal).

The invention may also, however, be applied in more sophisticated systems in which it is required to ensure that a particular guard is in a particular position. In this case, the detector circuit itself may be tuned so that it will only oscillate at the frequency of a specific tuned circuit.

The invention also resides in a detector for use in a machine guard installation, the detector comprising an active detector circuit which includes a pick-up coil, the circuit oscillating when the pick-up coil is magnetically coupled to a coil forming part of a passive tuned circuit.

Preferably, the active detector circuit includes an amplifier provided with an a.c. negative feedback circuit and an a.c. positive feedback circuit, said positive feedback circuit including the pick-up coil and being arranged to increase the positive feedback when the pick-up coil is coupled to a coil forming part of a passive tuned circuit.

Figure 2:
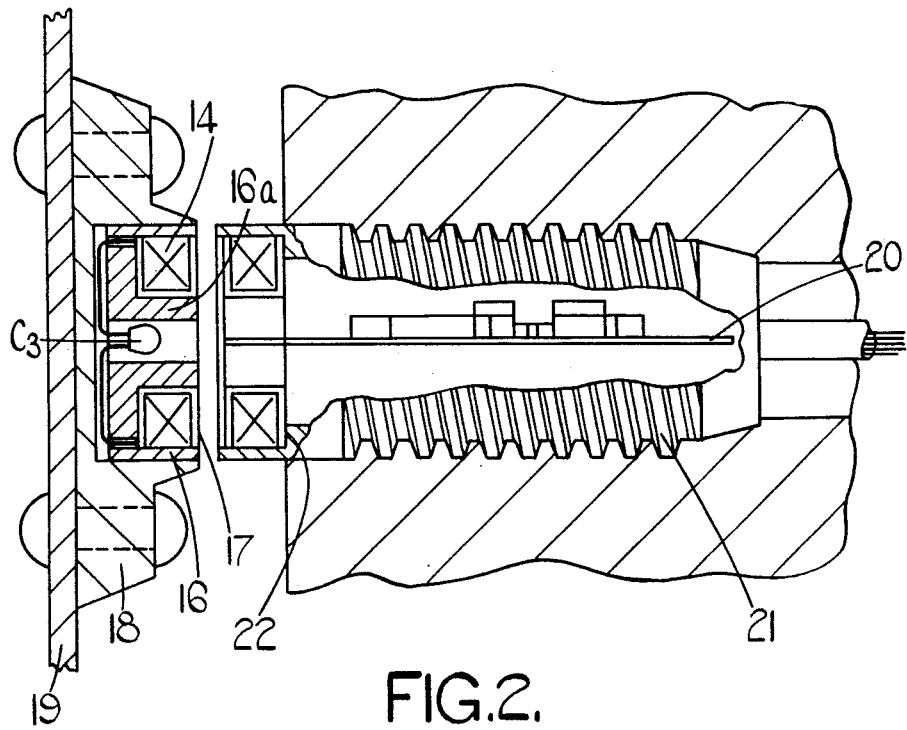

An example of the invention is shown in the accompanying drawing in which:

FIG. 1 is a circuit diagram of the detector circuit and tuned circuit of the installation and FIG. 2 is a diagrammatic part sectional view of the same parts.

The detector circuit shown in FIG. 1 includes an amplifier constituted by two n-p-n transistors TR1 and TR2. The collector of the transistor TR1 is connected to a positive supply rail 10 by a resistor R1 and also to the base of the transistor TR2 which has its collector connected to the rail 10. The emitter of the transistor TR2 is connected via a resistor R2 to the emitter of the transistor TR1 which is connected to a negative rail 11 via a winding 12. The emitter of the transistor TR2 is also connected by a resistor R3 and a capacitor C1 in parallel to the base of the transistor TR1 and this base is connected to the rail 11 by two resistors R4, R5 in series, with the resistor R5 bridged by a capacitor C2.

Stable d.c. operating conditions are established, with d.c. negative feedback from the emitter of the transistor TR2 to the base of the transistor TR1 via the resistor chain constituted by the resistors R3, R4 and R5. The a.c. negative feedback via the capacitor C1 exceeds the a.c. positive feedback caused by the winding 12 provided that this is not magnetically coupled to the tuned circuit. The amplifier does not oscillate in these conditions.

If, however, a passive tuned circuit 13 consisting of a winding 14 and a capacitor $C_3$ is positioned with its winding 14 magnetically coupled to the winding 12 the apparent resistance of the winding 12 at the resonant frequency of the circuit 13 will increase sharply and as a result the a.c. positive feedback at this frequency will be increased and the amplifier will go into oscillation at the resonant frequency of the tuned circuit 13.

The emitter of the transistor TR2 is a.c. coupled by a capacitor $C_4$ to the anode of a diode $D_1$, and the cathode of a diode $D_2$. The cathode of the diode $D_1$, is connected to the rail 10 and the anode of the diode $D_2$ is connected by a capacitor $C_5$ to the rail 10 and by a resistor $R_6$ to the base of a p-n-p transistor TR3. The emitter of the transistor TR3 is connected to the rail 10 and its collector is connected via a resistor $R_7$ to an output terminal 15.

When the tuned circuit 13 is absent the transistor TR3 is off, but the latter is turned on when the amplifier goes into oscillation the capacitor $C_5$ being charged by the signal at the emitter of TR2 rectified by the diodes $D_1$, $D_2$, acting with the capacitor $C_4$ as a voltage doubler.

FIG. 2 shows how the circuit of FIG. 1 is incorporated in a machine tool guard installation. The tuned circuit 13 is carried by a ferrite core 16, the winding 14 being provided on a bobbin 17 carried on a hollow spigot 16a at the centre of the core. The capacitor $C_3$ is carried inside the hollow spigot 16a. The core 16 is attached to a mounting bracket 18 which is mounted on a guard 19 forming a removable part of the casing of the machine tool structure. The detector circuit 20 which is carried on a conventional printed circuit board, is mounted within a housing 21 of insulating material carrying the winding 12 on a bobbin 22 at one end. The housing 21 is fixed to the machine tool structure, for example using an external screw thread, in a position such that when the guard is in place the two bobbins 17, 22 are coaxial and adjacent one another. The core 16 improves the coupling between the windings 12, 14. The output terminal 15 is connected to the machine tool control system so as to prevent operation of the machine tool with the guard 19 removed.

The tuned circuit 13 need not necessarily be provided with a core and may consist quite simply of a thin annular winding with a capacitor inside the winding. Where the invention is to be applied to a movable guard which can be situated in any of a range of working positions, the guard may be provided with an array of overlapping tuned circuits of this form, so that at least one of the windings will be sufficiently coupled to the winding 12 of the detector circuit to cause oscillation when the guard is in any position within this range.

I claim:

1. A machine guard installation including a guard movable out of an operative guarding position, a passive tuned circuit mounted on the guard, said tuned circuit includina a coil, and an active detector circuit comprising an amplifier including a pick-up coil which is magnetically coupled to the tuned circuit when the guard is in its operative position, said amplifier having an AC feedback path which includes the pick-up coil so that the increase in the apparent series resistance of the pick-up coil, occuring when the guard moves into its operative position, causes oscillation of the detector circuit.

2. An installation as claimed in claim 1 in which the detector is itself tuned to the frequency of the tuned circuit.

3. An installation in accordance with claim 1, wherein said feedback path, which includes said pick-up coil, comprises a positive feedback path, said positive feedback path carrying positive feedback increasing when the pick-up coil is coupled with the coil of the tuned circuit, said amplifier also provided with a negative feedback path.

4. An installation as claimed in claim 1 in which the detector circuit also includes a diode/capacitor rectifier arrangement sensitive to the a.c. output of the amplifier.

5. An installation as claimed in claim 4 in which the diode/capacitor rectifier arrangement is a voltage doubler including a capacitor connected to the output terminal of the amplifier, a first diode connected between the coupling capacitor and a supply rail and a second diode connected in series with a further capacitor between the coupling capacitor and the supply rail.

6. An installation as claimed in claim 5 including an output transistor having its emitter connected to said supply rail and its base connected to the junction of the second diode and the further capacitor.

7. A detector for use in a machine guard installation comprising:
an active detector circuit having an amplifier including an AC feedback path, said feedback path including a pick-up coil; and
a tuned circuit capable of being magnetically coupled to said pick-up coil thereby increasing the apparent series resistance of the pick-up coil and causing said amplifier to oscillate.

8. The detector of claim 7, wherein said feedback path includes said pick-up coil and provides positive feedback, said positive feedback increasing when said pick-up coil is coupled with the coil of said tuned circuit, said amplifier additionally provided with a negative feedback path which inhibits oscillation of the amplifier unless the pick-up coil is coupled with the coil of the tuned circuit.

9. A detector as claimed in claim 7 in which the detector circuit also includes a diode/capacitor rectifier arrangement sensitive to the a.c. output of the amplifier.

10. A detector as claimed in claim 9 in which the diode/capacitor rectifier arrangement is a voltage doubler including a capacitor connected to the output terminal of the amplifier, a first diode connected between the coupling capacitor and a supply rail and a second diode connected in series with a further capacitor between the coupling capacitor and the supply rail.

11. A detector as claimed in claim 10 including an output transistor having its emitter connected to said supply rail and its base connected to the junction of the second diode and the further capacitor.

12. A detector as claimed in any of claim 7 in which the amplifier comprises first and second transistors of the same conductivity type, a first resistor connecting the collector of the first transistor to a supply rail, the second transistor having its base direct coupled to the collector of the first transistor, its collector connected to the supply rail and its emitter connected by a second resistor to the emitter of the first transistor, the winding being connected between the emitter of the first transistor and a further supply rail a biasing resistor chain connected between the emitter of the second transistor and said further supply rail, the base of the first transistor being connected to a point on said resistor chain, and an a.c. negative feedback capacitor connected between the emitter of the second transistor and the base of the first transistor.

13. A detector as claimed in claim 12 including a further capacitor connected between a further point on the resistor chain and the further supply rail.

* * * * *